(12) United States Patent
Blanckaert et al.

(10) Patent No.: US 12,210,323 B2
(45) Date of Patent: Jan. 28, 2025

(54) WATCH DIAL HAVING AN ORGANIC LIGHT-EMITTING DIODE DISPLAY WITH RESIN

(71) Applicant: The Swatch Group Research and Development Ltd, Marin (CH)

(72) Inventors: Nicolas Blanckaert, Boudry (CH); Cécile Barron, Corcelles (CH); Jérôme Thiault, Colombier (CH); Cyrille Gernez, Boudry (CH)

(73) Assignee: The Swatch Group Research and Development Ltd, Marin (CH)

( * ) Notice: Subject to any disclaimer, the term of this patent is extended or adjusted under 35 U.S.C. 154(b) by 320 days.

(21) Appl. No.: 16/953,529

(22) Filed: Nov. 20, 2020

(65) Prior Publication Data
US 2021/0200161 A1    Jul. 1, 2021

(30) Foreign Application Priority Data

Dec. 30, 2019   (EP) ..................................... 19220037

(51) Int. Cl.
*G04G 9/10*   (2006.01)
*H10K 50/818*   (2023.01)
(Continued)

(52) U.S. Cl.
CPC ............. *G04G 9/10* (2013.01); *H10K 50/818* (2023.02); *H10K 50/828* (2023.02); *H10K 50/84* (2023.02); *H10K 59/00* (2023.02); *H10K 71/00* (2023.02)

(58) Field of Classification Search
CPC ........ G04G 9/10; G04G 17/045; H01L 27/32; H01L 51/5218; H01L 51/5234;
(Continued)

(56) References Cited

U.S. PATENT DOCUMENTS 7,883,255 B2 *   2/2011   Winkler ............. G04B 45/0015
                                                            362/625
2001/0004900 A1 *   6/2001   Ziegler ................. H01L 31/056
                                                            136/258
(Continued)

FOREIGN PATENT DOCUMENTS

JP   2002-75657 A   3/2002
JP   2006-59582 A   3/2006
(Continued)

OTHER PUBLICATIONS

Office Action dated Mar. 16, 2021 from the Japanese Patent Office in JP Application No. 2020-197924.
European Search Report of EP 19 22 0037 dated Jun. 30, 2020.

*Primary Examiner* — Caleb E Henry
(74) *Attorney, Agent, or Firm* — Sughrue Mion, PLLC

(57) ABSTRACT

A watch dial having an organic light-emitting diode display. The display includes an anode, a structured layer of coloured resin, which is preferably photosensitive, in contact with the anode. The display further includes an organic layer stack in contact with the anode and with the structured coloured resin layer. At least one of the organic layers is a light-emitting layer. The display also includes a cathode in contact with the organic layer stack. Also, a watch including the dial and a method for manufacturing the dial.

12 Claims, 2 Drawing Sheets

(51) Int. Cl.
    *H10K 50/828*     (2023.01)
    *H10K 50/84*     (2023.01)
    *H10K 59/00*     (2023.01)
    *H10K 71/00*     (2023.01)

(58) Field of Classification Search
    CPC . H01L 51/5237; H01L 51/56; H01L 51/5206; H01L 27/3241; H01L 51/0018; H01L 51/0019; H01L 51/0096; H01L 51/5221; Y02E 10/549; G04B 45/00; G04B 19/10; G04D 3/00; H10K 50/818; H10K 50/828; H10K 50/84; H10K 59/00; H10K 71/00; H10K 71/233; H10K 71/236; H10K 77/10; Y02P 70/50
    See application file for complete search history.

(56) References Cited

U.S. PATENT DOCUMENTS

| | | | |
|---|---|---|---|
| 2003/0042847 A1 | 3/2003 | Usui et al. | |
| 2005/0040758 A1 | 2/2005 | Wolk et al. | |
| 2005/0266763 A1* | 12/2005 | Kimura | H01L 51/0005 445/24 |
| 2007/0176537 A1* | 8/2007 | Ha | H10K 59/12 313/503 |
| 2008/0303424 A1* | 12/2008 | Mitsuya | H01L 27/3246 313/504 |
| 2009/0261722 A1* | 10/2009 | Koo | H10K 50/125 313/504 |
| 2010/0210078 A1* | 8/2010 | Miyairi | H01L 21/76254 438/22 |
| 2010/0253225 A1* | 10/2010 | Lifka | A61N 5/0616 438/42 |
| 2014/0326976 A1* | 11/2014 | Shiratori | H01L 51/5044 257/40 |
| 2016/0035803 A1* | 2/2016 | Kim | H01L 27/3246 438/34 |
| 2016/0179057 A1* | 6/2016 | Stranczl | G04B 45/0076 368/285 |
| 2017/0031323 A1* | 2/2017 | Kim | H01L 27/3262 |
| 2017/0205771 A1 | 7/2017 | Lin et al. | |
| 2017/0268111 A1* | 9/2017 | Manasterski | G04B 13/02 |
| 2017/0285575 A1* | 10/2017 | Turcotte | G04B 45/0015 |
| 2019/0018372 A1* | 1/2019 | Blanckaert | G04B 19/30 |
| 2019/0137942 A1* | 5/2019 | Smith | G04G 21/04 |

FOREIGN PATENT DOCUMENTS

| | | |
|---|---|---|
| JP | 2007-234526 A | 9/2007 |
| WO | 2005/059662 A2 | 6/2005 |

\* cited by examiner

WATCH DIAL HAVING AN ORGANIC LIGHT-EMITTING DIODE DISPLAY WITH RESIN

CROSS REFERENCE TO RELATED APPLICATIONS

This application is claiming priority based on European Patent Application No. 19220037.6 filed on Dec. 30, 2019, the disclosure of which is incorporated herein in its entirely by reference.

FIELD OF THE INVENTION

The invention concerns a watch dial having an organic light-emitting diode display, a watch comprising said watch dial and a method for manufacturing a watch dial having an organic light-emitting diode display.

BACKGROUND OF THE INVENTION

An organic light-emitting diode display (OLED) is composed of several layers of organic materials sandwiched between two electrodes. Light is emitted in one of the layers of organic material when a current passes therethrough (the display is in a so-called 'ON' mode). If it is desired for the light emission areas to be located between the two electrodes, an electrically insulating, so-called 'passivation' layer is added to one of the electrodes. This passivation layer is transparent. The final rendering of a 'bottom emission' type OLED in the so-called 'OFF' state, i.e. with no current passing through, is either the colour of the cathode (metallic appearance) or completely black if a circular polarizer is placed on the OLED display.

GENERAL DESCRIPTION OF THE INVENTION

A first aspect of the invention concerns a watch dial having an organic light-emitting diode display. The display comprises an anode and a structured layer of coloured resin, which is preferably photosensitive, in contact with the anode. The display further comprises an organic layer stack in contact with the anode and with the structured coloured resin layer. At least one of the organic layers is a light-emitting layer. The display also comprises a cathode in contact with the organic layer stack.

It will be appreciated that the watch dial having an organic light-emitting diode display can be decorative even when the display is in an 'OFF' state. Indeed, the structure of the structured coloured resin layer makes it possible, for example, to create a pattern in which parts of the cathode are visible, or at least partially visible, and other parts are hidden by the structured coloured resin layer. This is in contrast to prior art solutions wherein, in the 'OFF' state, only one uniform colour is visible (metallic or black if a circular polarizer is placed on the display).

According to one embodiment, several coloured resins, having different colours, can be used to form the structured layer.

According to one embodiment, the organic layers are semiconducting.

The structured coloured resin layer can be coated with an electrically insulating layer. An 'electrically insulating layer' means a layer formed of materials whose electrical conductivity does not exceed $10^{-8}$ Siemens/cm. It will be appreciated that covering the structured layer with an electrically insulating layer makes it possible to use resins which might be electrically conductive while retaining a high-contrast decorative pattern in the 'ON' state.

The structured coloured resin layer can have gaps in which the organic layer stack is in direct contact with the anode. Conduction channels can be created between the anode and the cathode by gaps in the structured coloured resin layer. Typically, the thickness of the coloured resin layer or layers is comprised between 500 nm and 2 microns.

According to a particular embodiment, the cathode is made of aluminium. According to a preferred embodiment, the thickness of the cathode is comprised in the range from 50 nm to 100 nm. Preferably, the cathode is reflective.

The anode can be transparent and is preferably made of indium-tin oxide (also called ITO film). The thickness of the anode can be comprised in the range from 100 nm to 200 nm.

The thickness of the organic stack can be comprised in the range from 100 nm to 200 nm.

According to a preferred embodiment, the anode and/or the cathode are structured. It will be appreciated that structuring makes it possible to selectively place certain areas in the 'ON' state and others in the 'OFF' state. It is thus possible to display information on demand, such as the time, date, and/or a logo.

According to one embodiment, a digital inkjet printed layer can be added to the transparent electrode.

A second aspect of the invention concerns a watch comprising a watch dial as described above.

A third aspect of the invention concerns a method for manufacturing a watch dial having an organic light-emitting diode display preferably as described above. The method includes:
  depositing a structured coloured resin layer on an anode, wherein the coloured resin is preferably photosensitive;
  depositing an organic layer stack on the anode and the structured coloured resin layer, wherein at least one of the organic layers is a light-emitting layer; and
  depositing a cathode on the organic layer stack.

The structured coloured resin layer is deposited by inkjet printing, by silk screen printing, by flexography and/or by heliography.

An electrically insulating layer can be deposited on the structured coloured resin layer prior to deposition of the organic layer stack.

The organic layer stack can be made by vacuum evaporation, by vapour phase deposition and/or by digital inkjet printing of one or more organic, possibly semiconducting materials, deposited to form the stack.

BRIEF DESCRIPTION OF THE DRAWINGS

Other peculiarities and features of the invention will appear from the detailed description of certain advantageous embodiments presented below, by way of illustration, with reference to the annexed drawings which show.

DETAILED DESCRIPTION OF SEVERAL EMBODIMENTS OF THE INVENTION

Figure 1:
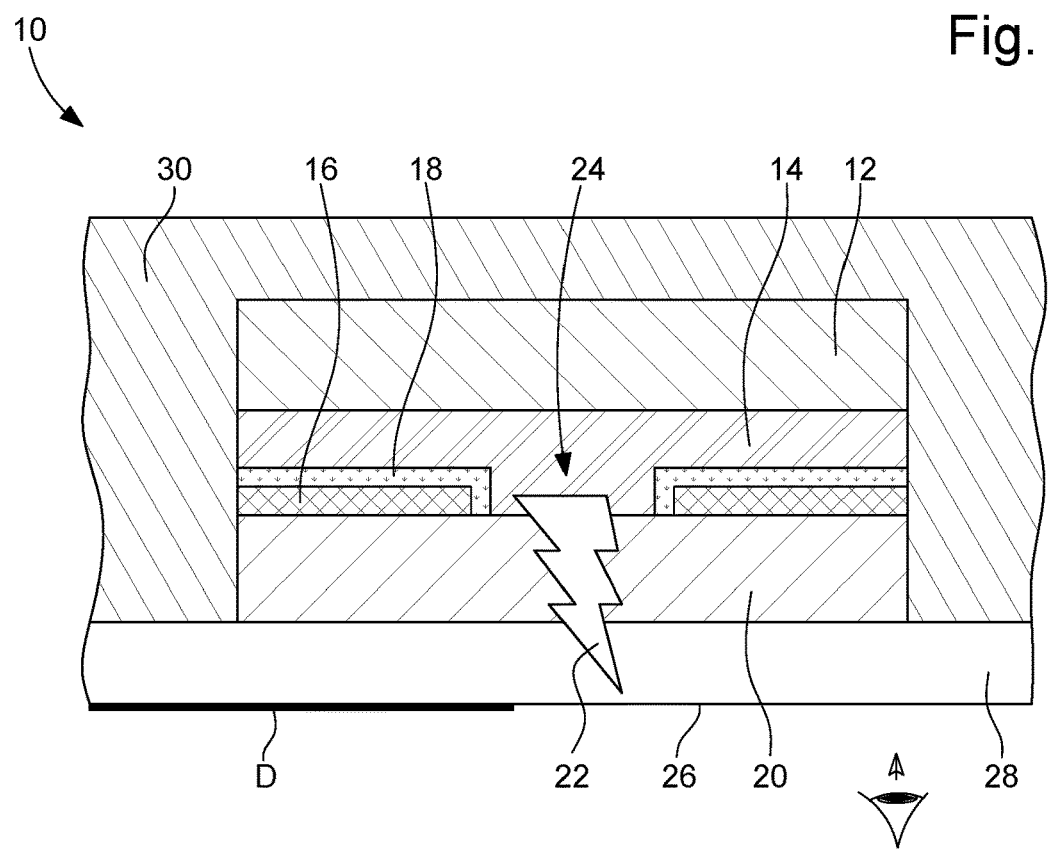
FIG. 1: a simplified cross-section of an organic light-emitting diode watch dial display according to a preferred embodiment of the invention.

FIG. 1 shows a simplified cross-section of a watch dial display 10 according to a preferred embodiment of the invention. Display 10 is an organic light-emitting diode display. The display comprises a reflective aluminium cathode 12, an organic layer stack 14, a structured coloured resin layer 16 (this resin layer being coated with an electrically insulating layer 18 when resin layer 16 is semiconducting) and a transparent indium tin oxide anode 20 deposited on a glass substrate (not represented). The display is a bottom emission display in the sense that the light emitted by organic layer stack 14 leaves display 10 through anode 20 and the substrate.

Cathode 12 and anode 20 are configured to create a potential difference. This potential difference can induce a current in the event that the material or materials placed between cathode 12 and anode 20 are electrically conductive. In particular, organic layer stack 14 placed between cathode 12 and anode 20 is conductive or semiconducting, thereby allowing the current to pass through the stack. At least one of the layers of organic layer stack 14 is light-emitting. The emission of light from the light-emitting layer is the result of the radiative recombination of the electrons and holes forming the current in said light-emitting layer. The wavelength emitted by the light-emitting layer depends, amongst other things, on the material of the light-emitting layer.

As indicated above, the display comprises a structured coloured resin layer 16 coated with an electrically insulating layer 18. The electrically insulating layer 18 prevents a current passing between the cathode and the anode. Thus, no current is present in the areas comprising electrically insulating layer 18. It is to be noted that it is not necessary to coat the entire surface of the coloured resin with an electrically insulating layer. Only the areas that would be in direct contact with the stack need to be coated (see FIG. 1). In addition to being decorative (i.e. forming an internal decoration of the display), the coloured resin can also perform the function of electrically insulating layer 18 in the event that the resin is itself electrically insulating.

Structured coloured resin 16 is structured to include gaps 24 in which the organic layer stack is in direct contact with anode 20 (see FIG. 1). Vertical conduction channels are created between anode 20 and cathode 12 by gaps 24. Consequently, localised light emission areas are created in the display.

Figure 2:
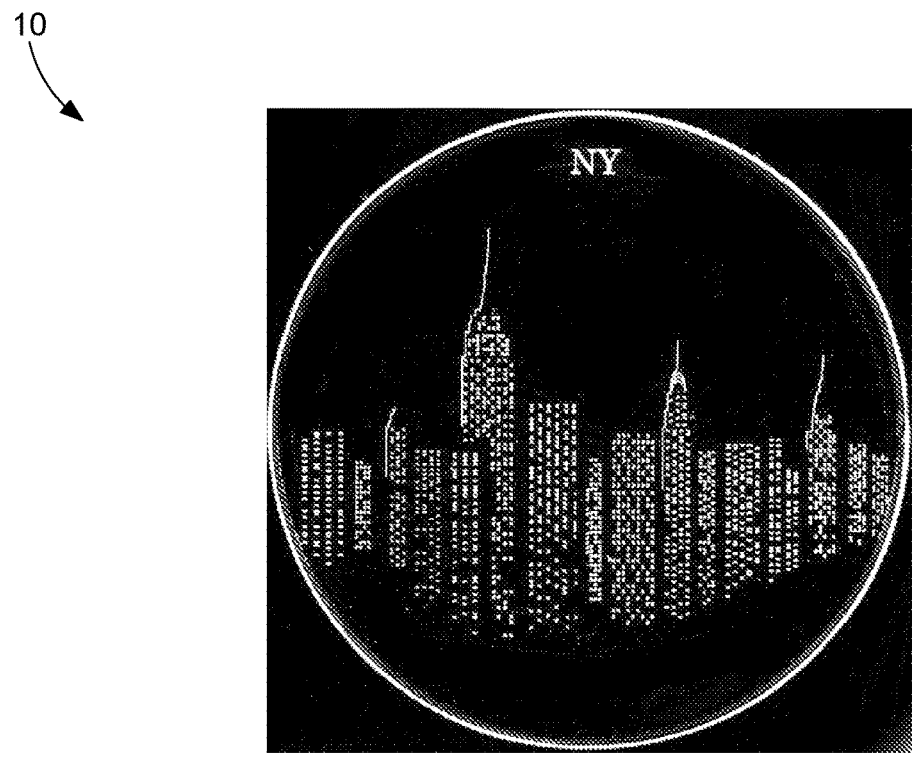
FIG. 2: a decorative pattern in the 'OFF' state of a watch dial display having an organic light-emitting diode display according to one embodiment of the invention.

The structuring of coloured resin layer 16 can make it possible to offer displays with decorative patterns that are visible both in the 'OFF' state (without light emission) and in the 'ON' state (with light emission). FIG. 2 represents, for example, a display showing New York skyscrapers in the 'OFF' state. Areas shown in black are areas coated with a black resin. Areas shown in white (e.g. the windows) are areas devoid of resin (gaps) making the cathode visible. As the cathode is reflective, the incident light that reaches the areas revealing the cathode is reflected towards the watch user and gives a metallic appearance. In the 'ON' state, the resin-free areas are traversed by a current and illuminated by the emission of light in the light-emitting layer.

The thickness of cathode 12 is comprised in the range from 50 nm to 100 nm. The thickness of anode 20 is comprised in the range from 100 nm to 200 nm. The thickness of stack 14 is comprised in the range from 100 nm to 200 nm. The thickness of layers 16 and 18 are each between 500 nm and 1 micron.

Figure 3:
FIG. 3: a decorative pattern of a watch dial display having an organic light-emitting diode display according to one embodiment of the invention.

Cathode 12 and/or anode 20 can be structured. In such case, it is possible to selectively illuminate certain display areas (only some areas of the display are then in the 'ON' state). The areas to be illuminated or not can be controlled by means of a control circuit. In this manner, it is possible to display information, such as the time and date. FIG. 3 represents such a case. The number '23' is displayed by a passage of current while no current passes through the rest of the decorative pattern (there is no light emitted in the windows). The windows remain clearly visible even though no light is emitted therefrom.

An external decoration D can be disposed on surface 26, which is on the user's side, of a substrate 28 carrying display 10, the latter being coated with an insulating coating material 30. Decoration D is typically applied by printing, for example by inkjet printing. Alternatively, the decoration can be deposited on surface 26 by silk screen printing, by pad printing, flexography and/or by heliography.

According to an alternative embodiment, the display 10 illustrated in FIG. 1 could be a top emission display. This embodiment differs from the embodiment illustrated in FIG. 1 in that the cathode is transparent and the anode is reflective.

The method for manufacturing the dial described above comprises the following successive steps: depositing and structuring anode 20 on the glass substrate, depositing and structuring a coloured resin layer on the anode, depositing and structuring an electrically insulating layer on the structured coloured resin layer, depositing and structuring an organic layer stack on the anode and the structured coloured resin layer (at least one of the organic layers is a light-emitting layer) and depositing a cathode on the organic layer stack.

The deposition and structuring can be achieved by photolithography, by inkjet printing, by silk screen printing, by flexography and/or by heliography. The resin is preferably photosensitive for deposition and structuring by photolithography.

The organic layer stack can be deposited by vacuum evaporation, by vapour phase deposition and/or by digital inkjet printing of one or more organic, possibly semiconducting materials, deposited to form the stack.

Although particular embodiments have just been described in detail, those skilled in the art will appreciate that various modifications and alternatives thereto could be developed in light of the overall teaching provided by the present disclosure of the invention. Consequently, the specific arrangements and/or methods described herein are intended to be given purely by way of illustration, with no intention of limiting the scope of the invention.

The invention claimed is:

1. A watch dial having an organic light-emitting diode display, the display comprising:
   an anode;
   a structured layer of coloured resin in contact with the anode;
   an organic layer stack in contact with the anode and with the structured coloured resin layer, at least one of the organic layers being a light-emitting layer; and
   a cathode in contact with the organic layer stack,
   wherein at least one of:
   the thickness of the cathode is comprised in the range from 50 nm to 100 nm,
   the thickness of the anode is comprised in the range from 100 nm to 200 nm, and
   the thickness of the stack is comprised in the range from 100 nm to 200 nm.

2. The watch dial according to claim 1, wherein the structured coloured resin layer is coated with an electrically insulating layer.

3. The watch dial according claim 2, wherein the thickness of the electrically insulating layer is comprised between 500 nm and 1 micron.

4. The watch dial according to claim 1, wherein the structured coloured resin layer comprises gaps in which the organic layer stack is in direct contact with the anode.

5. The watch dial according to claim 1, wherein conduction channels are created between the anode and cathode by gaps in the structured coloured resin layer.

6. The watch dial according to claim 1, wherein the cathode is reflective.

7. The watch dial according to claim 1, wherein the cathode is made of aluminium.

8. The watch dial according to claim 1, wherein the anode is made of indium-tin oxide.

9. The watch dial according to claim 1, wherein the anode and/or the cathode are structured.

10. The watch dial according to claim 1, wherein the thickness of the structured coloured resin layer in contact with the anode is comprised between 500 nm and 1 micron.

11. The watch dial according to claim 1, wherein a decoration D is disposed on the surface of a substrate carrying the display, said surface being disposed on the side visible to the user.

12. A watch comprising a watch dial having an organic light-emitting diode display, the display comprising:
    an anode;
    a structured layer of coloured resin in contact with the anode;
    an organic layer stack in contact with the anode and with the structured coloured resin layer, at least one of the organic layers being a light-emitting layer; and
    a cathode in contact with the organic layer stack,
    wherein at least one of:
        the thickness of the cathode is comprised in the range from 50 nm to 100 nm,
        the thickness of the anode is comprised in the range from 100 nm to 200 nm, and
        the thickness of the stack is comprised in the range from 100 nm to 200 nm.

* * * * *